US009330749B1

(12) United States Patent
Choksey et al.

(10) Patent No.: US 9,330,749 B1
(45) Date of Patent: May 3, 2016

(54) DYNAMIC SELECTION OF OUTPUT DELAY IN A MEMORY CONTROL DEVICE

(71) Applicant: Xilinx, Inc., San Jose, CA (US)

(72) Inventors: Dhruv Choksey, San Jose, CA (US); Terence J. Magee, San Francisco, CA (US)

(73) Assignee: XILINX, INC., San Jose, CA (US)

( * ) Notice: Subject to any disclaimer, the term of this patent is extended or adjusted under 35 U.S.C. 154(b) by 30 days.

(21) Appl. No.: 14/519,562

(22) Filed: Oct. 21, 2014

(51) Int. Cl.
*G11C 11/4063* (2006.01)

(52) U.S. Cl.
CPC .................................. *G11C 11/4063* (2013.01)

(58) Field of Classification Search
CPC .................................................. G11C 11/4063
USPC ......................................................... 365/189.02
See application file for complete search history.

(56) References Cited

U.S. PATENT DOCUMENTS

| 7,301,831 B2* | 11/2007 | Ware | G06F 13/1689 365/191 |
| 7,590,008 B1* | 9/2009 | Roge | G11C 5/04 365/189.011 |
| 7,839,716 B2* | 11/2010 | Kong | G11C 7/1093 365/194 |
| 2010/0185810 A1* | 7/2010 | Cline | G06F 13/1689 711/105 |
| 2014/0244922 A1* | 8/2014 | Bains | G11C 7/1072 711/105 |

* cited by examiner

*Primary Examiner* — Hoai V Ho
*Assistant Examiner* — Tri Hoang
(74) *Attorney, Agent, or Firm* — Robert M. Brush (57) ABSTRACT

In an example, a memory control device includes an output circuit, an output delay unit, and a write-levelization controller. The output circuit is coupled to provide an output signal comprising a data signal or data strobe signal for a synchronous dynamic random access memory (SDRAM) system having a plurality of ranks. The output delay unit is coupled to apply an output delay to a bitstream to be transmitted to generate the output signal. The output delay includes an aggregate of a de-skew delay and a write-levelization delay. The write-levelization delay controller is coupled to adjust the write-levelization delay for each write transaction to the SDRAM system of a plurality of write transactions based on a selected rank of the plurality of ranks. The de-skew delay is the same across the plurality of ranks for each of the plurality of write transactions.

20 Claims, 5 Drawing Sheets

DYNAMIC SELECTION OF OUTPUT DELAY IN A MEMORY CONTROL DEVICE

TECHNICAL FIELD

Examples of the present disclosure generally relate to electronic circuits, in particular, to dynamic selection of output delay in a memory control device.

BACKGROUND

Double Data Rate, or "DDR" synchronous dynamic random access memories (SDRAMs) are popular due to their performance and density. In order to reduce the amount of real estate on the memory chips, much of the burden of controlling the devices has been offloaded to a memory control device. These memory control devices can reside on microprocessor, application specific integrated circuits (ASIC), field programmable gate array (FPGA) devices or the like, or alternately can reside on devices dedicated solely to the purpose of controlling DDR memories.

In DDR3 and DDR4 applications, the memory control device must insert various types and amounts of delays on the output path with a bit-level granularity. The output delays are required to compensate for various skews present or potentially present within the memory control device, on the printed circuit board (PCB) that connects the memory control device to the SDRAM device(s), on the SDRAM device(s), or a combination thereof. The output delays inserted by the memory control device allow for the interface signals arriving at the SDRAM device(s) to be realigned for proper sampling. The circuitry used to generate and apply the output delays in the memory control device can be complex, encompassing significant integrated circuit (IC) area and can consume significant power.

SUMMARY

Techniques for dynamic selection of output delay in a memory control device are described. In an example, a memory control device includes an output circuit, an output delay unit, and a write-levelization controller. The output circuit is coupled to provide an output signal comprising a data signal or data strobe signal for a synchronous dynamic random access memory (SDRAM) system having a plurality of ranks. The output delay unit is coupled to apply an output delay to a bitstream to be transmitted to generate the output signal. The output delay includes an aggregate of a de-skew delay and a write-levelization delay. The write-levelization delay controller is coupled to adjust the write-levelization delay for each write transaction to the SDRAM system of a plurality of write transactions based on a selected rank of the plurality of ranks. The de-skew delay is the same across the plurality of ranks for each of the plurality of write transactions.

In another example, a method of operating a memory control device includes: providing an output signal comprising a data signal or a data strobe signal for a synchronous dynamic random access memory (SDRAM) system having a plurality of ranks; applying an output delay to a bitstream to be transmitted to generate the output signal, the output delay comprising an aggregate of a de-skew delay and a write-levelization delay; and adjusting the write-levelization delay for each write transaction to the SDRAM system of a plurality of write transactions based on a selected rank of the plurality of ranks while the de-skew delay remains the same across the plurality of ranks for each of the plurality of write transactions.

In another example, a system includes an SDRAM system having a plurality of ranks and a memory control device coupled to the SDRAM system through a bus. The memory control device includes an output circuit, an output delay unit, and a write-levelization delay controller. The output circuit is coupled to provide an output signal comprising a data signal or data strobe signal. The output delay unit is coupled to apply an output delay to a bitstream to be transmitted to generate the output signal. The output delay includes an aggregate of a de-skew delay and a write-levelization delay. The write-levelization delay controller is coupled to adjust the write-levelization delay for each write transaction to the SDRAM system of a plurality of write transactions based on a selected rank of the plurality of ranks. The de-skew delay is the same across the plurality of ranks for each of the plurality of write transactions.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Techniques for dynamic selection of output delay in a memory control device are described. The techniques apply to multi-rank synchronous dynamic random access memory (SDRAM) systems, such as double data-rate (DDR) systems (e.g., DDR3/4 systems). The memory control device applies a single programmable delay on each data (DQ) and data strobe (DQS) signal output to the SDRAM. The memory control device dynamically selects the required per-signal output delay on DQ/DQS signals as dictated by rank selection. The output delay for a given DQ/DQS signal is divided into two parts to provide a simpler memory control solution. In particular, the output delay includes a de-skew delay for the particular output signal that is common across ranks, and a write-levelization delay for the particular output signal that is dynamically selected based on rank. The memory control device described herein provides for improved signal integrity, reduced aggregate intrinsic delays on the output path, and reduced implementation area and power consumption. These and further aspects of the present disclosure are discussed below.

Figure 1:
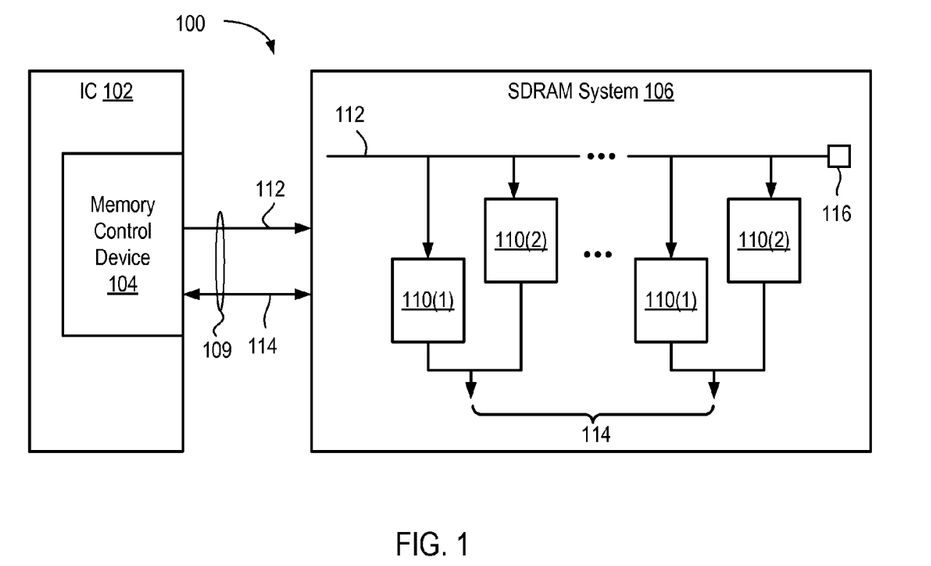
FIG. 1 is a block diagram showing an example system having an integrated circuit (IC) coupled to a synchronous dynamic random access memory (SDRAM) system.

FIG. 1 is a block diagram showing an example of a system 100 having an integrated circuit (IC) 102 coupled to a synchronous dynamic random access memory (SDRAM) system 106. The IC 102 and the SDRAM system 106 can be mounted on a printed circuit board (PCB) or other type of substrate (not shown). The IC 102 includes a memory control device 104. The memory control device 104 is coupled to the SDRAM system 106 through a bus 109. The bus 109 includes a control bus 112 and a data bus 114. The control bus 112 conveys control signals to the SDRAM system 106, such as address, command, and clock signals. The data bus 114 conveys data (DQ) signals and data strobe (DQS) signals between the memory control device 104 and the SDRAM system 106. The bus 109 can convey other signals, such as voltage supply signals. The IC 102 can be a device dedicated for the memory control device 104, or a device having other functionality, such as a microprocessor, application specific integrated circuit (ASIC), field programmable gate array (FPGA), system-on-chip (SoC), or the like. The SDRAM system 106 can include one or more modules that collectively provide a plurality of ranks (e.g., one or more dual inline memory modules (DIMMs)). Alternatively, the SDRAM system 106 can be mounted to a PCB without any specific modular structure. For example, the SDRAM system 106 can be mounted to the same PCB as the IC 102.

The SDRAM system 106 includes multiple ranks of SDRAM devices 110. As shown, the SDRAM system 106 includes two ranks: a first rank includes SDRAM devices 110(1) and a second rank includes SDRAM devices 110(2). Thus, each rank includes a plurality of SDRAM devices. The SDRAM devices 110(1) and 110(2) in each rank share the busses 112 and 114 driven by the memory control device 104. The control bus 112 includes a signal for selecting among the ranks. The SDRAM system 106 includes a "fly-by" memory topology. In the fly-by memory topology, the control bus 112 is connected to each of the SDRAM devices 110 and terminated by a termination 116. That is, the same set of address, command, and clock signals is coupled to every one of the SDRAM devices 110(1) in the first rank, and every one of the SDRAM devices 110(2) in the second rank. Example SDRAM devices employing a fly-by topology include DDR3 and DDR4 SDRAM devices.

In contrast, the bus 114 is coupled to the ranks in parallel. For example, each of the SDRAM devices 110 can include an interface having eight DQ signals and at least one DQS signal (e.g., a DQS signal and a negated DQS signal). Each rank can include nine SDRAM devices 110 for a total of 72 DQ signals and at least 9 DQS signals. The bus 114 can have a width of 72 DQ signals and at least 9 DQS signals, which are distributed across SDRAM devices in each rank and shared between ranks. The SDRAM devices 110 can have interfaces with other numbers of DQ and DQS signals, the ranks can have a different number of SDRAM devices, the data bus 114 can have other widths. For example, some SDRAM systems provide a data bus having a width of 144 DQ signals.

The SDRAM system 106 can include other circuits to support operation of the SDRAM devices 110, such as registers, controllers, and the like (not shown). While the example shows an unbuffered SDRAM system (i.e., the busses 112 are not buffered), the techniques described herein can be used with registered SDRAM systems. While the SDRAM system 106 is shown as having two ranks, in general the SDRAM system 106 can include a plurality of ranks.

Figure 2:
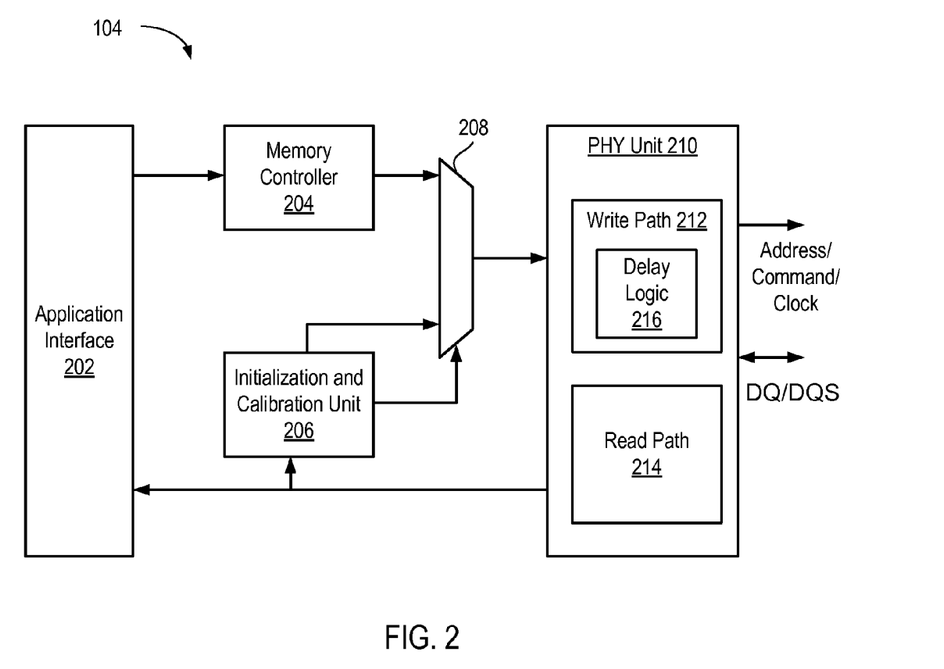
FIG. 2 is a block diagram showing an example of a memory control device.

FIG. 2 is a block diagram showing an example of the memory control device 104. The memory control device 104 includes an application interface 202, a memory controller 204, an initialization and calibration unit 206, a multiplexer 208, and a physical (PHY) unit 210. The application interface 202 receives data to be written to the SDRAM system 106 ("write data") from another circuit (not shown), and provides data read from the SDRAM system 106 ("read data") to another circuit (not shown). The application interface 202 provides the write data to the memory controller 204. The memory controller 204 generates transactions to and from the SDRAM system 106. The memory controller 204 generates write transactions to store the write data in the SDRAM system 106, and generates read transactions to obtain the read data from the SDRAM system 106. An output of the memory controller 204 is coupled to the multiplexer 208.

The PHY unit 210 provides the physical signal interface of the memory control device 104. The PHY unit 210 outputs address, command, and clock signals on the control bus 112, and sends and receives data and data strobe signals on the data bus 114. The PHY unit 210 includes write path logic 212 and read path logic 214. The write path logic 212 formats write transactions from the memory controller 204 for transmission of commands and write data to the SDRAM system 106. The read path logic 214 formats read transactions from the memory controller 204 for transmission of commands to, and reception of read data from, the SDRAM system 106.

The initialization and calibration unit 206 performs, among other actions, one or more stages of timing calibration for the write path logic 212 and the read path logic 214. The initialization and calibration unit 206 is coupled to the multiplexer 208. The initialization and calibration unit 206 outputs calibration transactions to the PHY unit 210 through the multiplexer 208. The initialization and calibration unit 206 controls the multiplexer 208 to select the calibration transactions until calibration is complete. When calibration is complete, the initialization and calibration unit 206 controls the multiplexer 208 to select the transactions output from the memory controller 204. The PHY unit 210 formats the calibration transactions to communicate with the SDRAM system 106 and calibrate the write path logic 212 and the read path logic 214.

In particular, the write path logic 212 includes delay logic 216. The delay logic 216 is used to compensate for static or quasi-static skews, including a per-signal PCB trace skew and any per-signal skews in the write path logic 212 of the PHY unit 210. The delay logic 216 applies an output delay to DQ/DQS signals that includes a de-skew delay that compensates for the static or quasi-static skews and centers the write data strobe (DQS) within the write data (DQ) window on the output path. The de-skew delay attributable to the static/quasi-static skews is determined based on the calibration process. During functional operation, other than for periodic compensation of voltage/temperature (VT) variations, the de-skew delays remain unchanged across a large number of write transactions. In a multi-rank system, the static/quasi-static skew can differ across ranks. However, techniques described herein simplify the problem of accurate write data timing by applying a common set of de-skew delays to compensate for static/quasi-static skew for all ranks of the SDRAM system 106. This assumes common DQ/DQS paths from the memory control device 104, through input/output (IO) logic (e.g., 10 logic in the IC 102), through the IC package, and onto a PCB, before diverging to each rank on the SDRAM system 106.

The fly-by memory topology of the SDRAM system 106 causes skew between the write data strobe (DQS) and the clock (CK) arriving at each SDRAM device 110 on the control bus 112. The skew between DQS and CK is compensated through a write-leveling technique, wherein the DQS signals are delayed until phase-aligned with the clock arriving at the SDRAM devices 110 within a given rank. An application may utilize multiple ranks across one or more SDRAM systems, each requiring a unique write levelization delay value. In a multi-rank system, it cannot be assumed that the timing relationship between CK and DQS is the same across ranks, since the clock (CK) takes a different path than DQ/DQS. The fly-by timing can differ across ranks.

The output delay applied by the delay logic 216 can include a write-levelization delay in addition to the de-skew delay. While the de-skew delay is common across ranks, the write-levelization delay is unique to each rank and is selected dynamically based on the particular rank selected for writing. Example techniques for generating the output delay for DQ/DQS signals on the data bus 114 are discussed below.

FIG. 2 shows one example of the memory control device 104. Examples described below relate to the structure and function of the delay logic 216. The delay logic 216 can be used in a PHY unit of a memory control device having a different structure than that shown in FIG. 2. In general, a PHY unit of a memory control device can use the delay logic 216 to compensate for skew on the write path.

Figure 3:
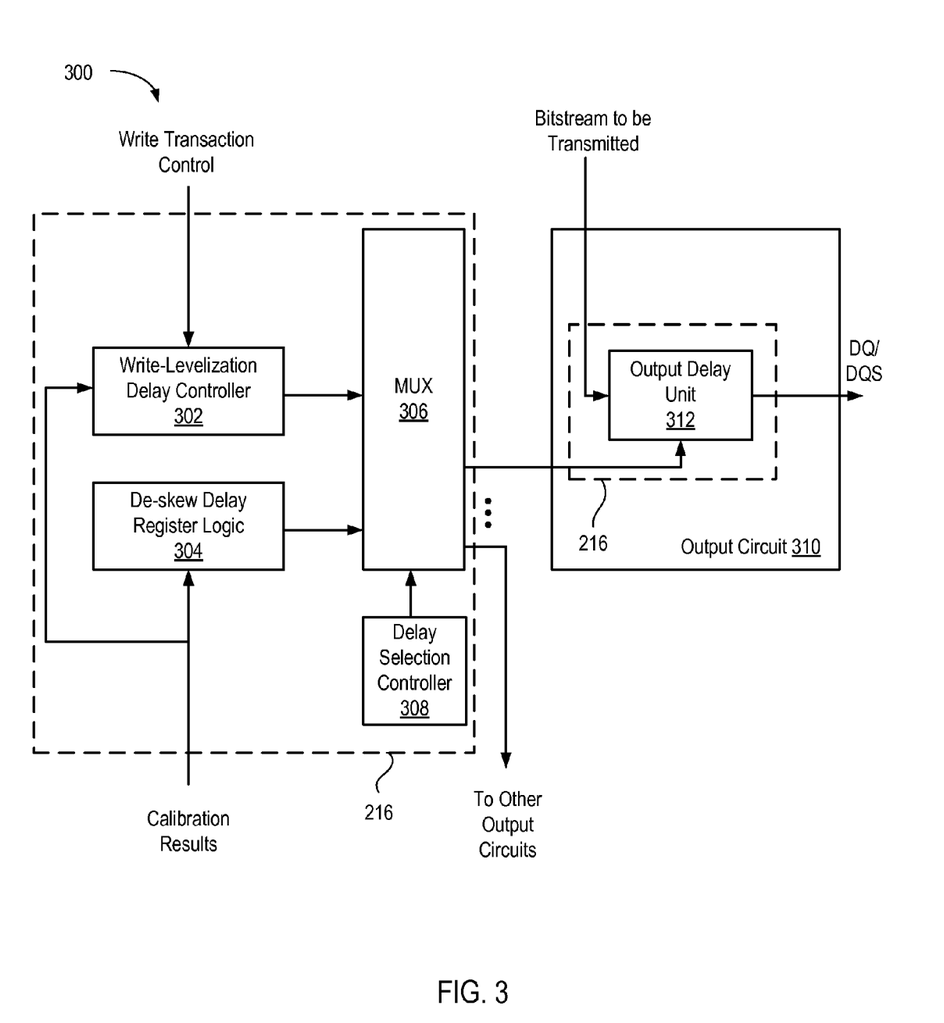
FIG. 3 is a block diagram showing an example of a portion of a physical interface unit.

FIG. 3 is a block diagram showing an example of a portion 300 of the PHY unit 210. The portion 300 includes a write-levelization delay controller 302, de-skew delay register logic 304, a multiplexer circuit (MUX) 306, a delay selection controller 308, and an output circuit 310. The output circuit 310 includes an output delay unit 312. The write-levelization delay controller 302, the de-skew delay register logic 304, the MUX 306, the delay selection controller 308, and output delay unit 312 comprise the delay logic 216 in the write path logic 212 of the PHY unit 210.

The output circuit 310 couples an output signal to the data bus 114. The output signal comprises a particular data signal (DQ) or a particular data strobe signal (DQS) on the data bus 114. The output signal is generated by selectively delaying a bitstream to be transmitted. The amount of delay applied to the bitstream to be transmitted to generate the output signal can be adjusted by changing the output delay applied by the output delay unit 312. During functional operation, the output delay comprises an aggregate of a de-skew delay and a write-levelization delay. The de-skew delay is the same across the ranks of the SDRAM system 106 for a plurality of write transactions. In contrast, the write-levelization delay is dynamically updated for each write transaction based on rank selected for writing. The value of the output delay applied by the output delay unit 312 is adjusted based on input received from the MUX 306.

The de-skew delay register logic 304 stores the per-signal, de-skew delay values for signals on the data bus 114. The per-signal, de-skew delay values are generated based on calibration results of the calibration operation. In an example, the per-signal, de-skew delay values can remain constant during functional operation. Alternatively, the per-signal, de-skew delay values can be periodically updated in response to periodic calibration operations. For example, periodic calibration operations can be performed for VT tracking. After initial calibration (or optional subsequent calibration), the delay selection controller 308 selects the de-skew delay register logic 304 and a de-skew delay value for the output signal is loaded into the output delay unit 312. The de-skew delay value for the output signal is the same across all ranks of the SDRAM system 106 and is not changed during functional operation from one write transaction to the next, and from one rank to the next.

The write-levelization delay controller 302 stores write-levelization delay values for all DQ/DQS signals for each of the ranks. The write-levelization delays can be generated based on calibration results of the calibration operation (e.g., can be determined in parallel to the per-signal, de-skew delay values). During functional operation, the write-levelization delay controller 302 determines a write-levelization delay value for the output signal based on the rank selected for writing as determined from write transaction control signals. After the de-skew delay value has be loaded in the output delay unit 312, the delay selection controller 308 selects the write-levelization delay controller 302 and determined write-levelization delay values are provided to the output delay unit 312. For each write transaction, the output delay unit 312 adds a determined write-levelization delay value to the de-skew value to determine an output delay value. In this manner, the output delay is dynamically updated based on the current rank of the SDRAM system 106 selected for writing.

In an example, for each write transaction, the write-levelization delay controller 302 determines a difference between a write-levelization delay value for a current rank and a write-levelization delay value for the previous rank. The write-levelization delay controller 302 provides the difference as the output. The output delay unit 312 adds the difference to the de-skew delay value to determine the output delay value. In this manner, the write-levelization delay value for the previously selected rank is removed from the output delay value, and the write-levelization delay value for the current rank is added to the output delay value. Thus, the output delay value is always an aggregate of the de-skew delay value and a write-levelization delay value determined for the current rank.

The MUX 306 can be coupled to other output circuits in the write path logic 212 having output delay units similar to the output circuit 310 for delaying other DQ/DQS signals on the data bus 114. The de-skew delay register logic 304 stores de-skew delay values for the output signals of the other circuits, which can be loaded to other output delay units similar to the output delay unit 312. The write-levelization delay controller 302 stores write-levelization delay values for other SDRAM devices for each of the ranks, which can be used to adjust the output delay units similar to the output delay unit 312 during functional operation. That is, the write-levelization delay controller 302 can store a write-levelization delay value for each SDRAM device, where a given write-levelization delay value is common for DQ/DQS signals associated with a given SDRAM device.

Figure 4:
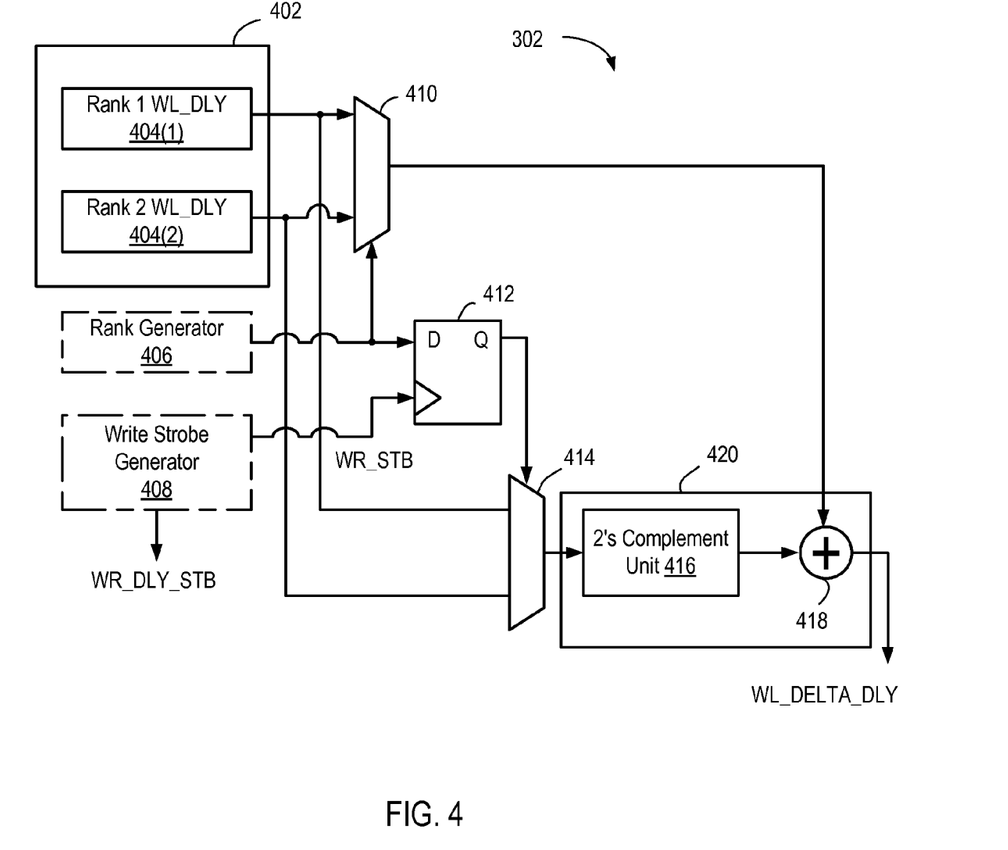
FIG. 4 is a block diagram showing an example of a write-levelization delay controller.

FIG. 4 is a block diagram showing an example of the write-levelization delay controller 302. The write-levelization delay controller 302 comprises write-levelization delay register logic 402, a first multiplexer (multiplexer 410), a flip-flop 412, a second multiplexer (multiplexer 414), and a computation unit 420. The write-levelization delay register logic 402 includes a plurality of registers 404, one for each rank of the SDRAM system 106. In the present example, two registers 404(1) and 404(2) are shown for the dual-ranks of the SDRAM system 106. The register 404(1) stores a write-levelization delay value for the rank comprising the SDRAM devices 110(1). The register 404(2) stores a write-levelization delay value for the rank comprising the SDRAM devices 110(2). The write-levelization delay values can be determined during a calibration operation, as discussed above.

Inputs of the multiplexer 410 are coupled to outputs of the registers 404(1) and 404(2). An output of the multiplexer 410 is coupled to the computation unit 420. A control port of the multiplexer 410 receives a signal indicative of a current rank selected for writing in a current write transaction ("current-rank signal"). In an example, the write-levelization delay controller 302 can include a rank generator 406 that generates a current-rank signal in response to write transaction control data generated by the write path logic 212. In another example, the current-rank signal is generated by another circuit in the write path logic 212 external to the write-levelization delay controller 302. In any case, the current-rank signal is also coupled to a data input of the flip-flop 412.

A clock port of the flip-flop 412 receives a signal indicative of a new write transaction entering the write path logic 212 (referred to as WR_STB). When the WR_STB signal is asserted, the flip-flop 412 stores a value of the current-rank signal. An output of the flip-flop 412 provides a value of a previously selected rank for a previous write transaction ("previous-rank signal"). In an example, the write-levelization delay controller 302 can include a write strobe generator 408 that generates the WR_STB signal in response to a write transaction entering the write path logic 212. In another example, the WR_STB signal is generated by another circuit in the write path logic 212 external to the write-levelization delay controller 302.

Inputs of the multiplexer 414 are coupled to outputs of the registers 404(1) and 404(2). An output of the multiplexer 414 is coupled to the computation unit 420. A control port of the multiplexer 414 is coupled to the output of the flip-flop 412 to receive the previous-rank signal.

For each write transaction, the computation unit 420 receives a write-levelization delay value selected by the multiplexer 410 for the current write transaction ("current write-levelization delay value") and a write-levelization delay value selected by the multiplexer 414 for the previous write transaction ("previous write-levelization delay value"). The current write-levelization delay value corresponds to the rank currently selected for writing and is selected based on the current-rank signal. The previous write-levelization delay value corresponds to the rank previously selected for writing and is selected based on the previous-rank signal. The computation unit 420 computes a difference between the current write-levelization delay value and the previous write-levelization delay value and provides the difference as an output signal (WL_DELTA_DLY). The WL_DELTA_DLY signal is coupled to the MUX 306 to be provided to an output delay unit to adjust output delay for each write transaction.

In an example, the computation unit 420 includes a 2's complement unit 416 coupled to an adder 418. The 2's complement unit 416 determines the negative of the previous write-levelization delay value provided by the multiplexer 414. The adder 418 sums the output of the 2's complement unit 416 with the current write-levelization delay value provided by the multiplexer 410. In an example, both the 2's complement unit 416 and the adder 418 drop the carry bit, allowing their outputs to rollover. The computation unit 420 can be implemented using other types of logic that generally computes a difference between the current and previous write-levelization delay values.

Figure 5:
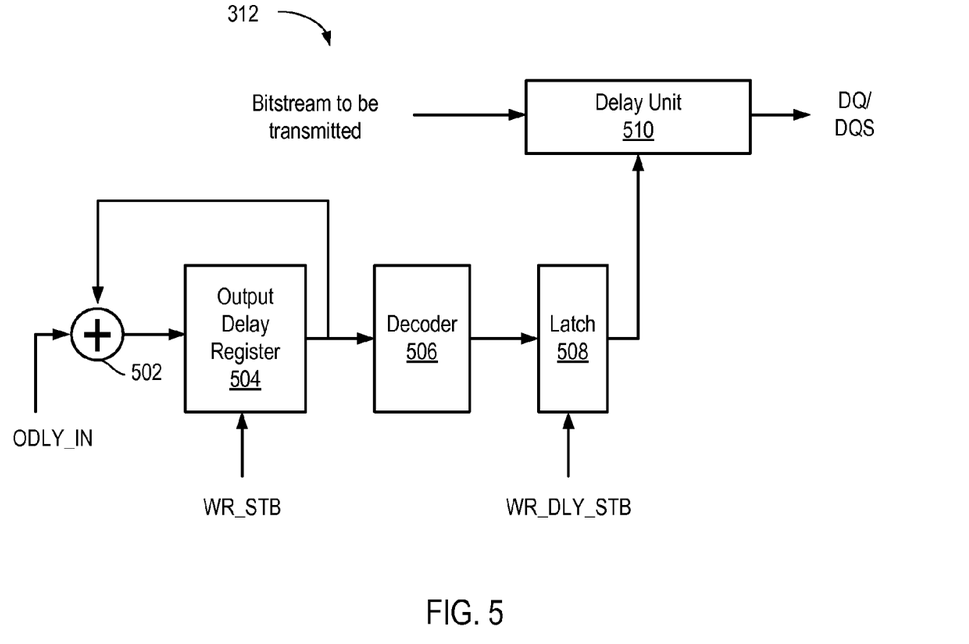
FIG. 5 is a block diagram showing an example of an output delay unit.

FIG. 5 is a block diagram showing an example of the output delay unit 312. The output delay unit 312 comprises an adder 502, an output delay register 504, a decoder 506, a latch 508, and a delay unit 510. The adder 502 receives a signal output by the MUX 306 (ODLY_IN) and an output of the output delay register 504 as addends. An output of the adder 502 is coupled to an input of the output delay register 504. The output delay register 504 generally stores a value of the output delay. In functional operation, the adder 502 sums a previous value of the output delay stored in the output delay register 504 with a difference between current and previous write-levelization delay values generated by the write-levelization delay controller 302 (WL_DELTA_DLY as selected by the MUX 306). In response to the start of a current write transaction (i.e., assertion of the WR_STB signal), the output delay register 504 loads a current value of the output delay from the adder 502.

An input of the decoder 506 is coupled to an output of the output delay register 504. The decoder 506 generates a decoded signal from the output delay value stored in the output delay register 504. An input of the latch 508 is coupled to an output of the decoder 506. The latch 508 stores a value of the decoded signal as the decoder 506 decodes the output delay value stored in the output delay register 504. The latch 508 provides the value of the decoded signal to the delay unit 510 in response to a signal indicating that the current write transaction is nearing the end of the write path logic 212 (WL_DLY_STB). The WL_DLY_STB signal is a delayed version of the WL_STB signal that can be generated by the write strobe generator 408 if present, or by another circuit in the write path logic 212.

An output of the latch 508 is coupled to a control input of the delay unit 510. An input of the delay unit 510 receives the bitstream to be transmitted and an output of the delay unit 510 provides the output signal (e.g., a DQ signal or a DQS signal). The value of the decoded signal stored in the latch 508 determines the amount of delay applied by the delay unit 510. For example, the delay unit 510 can include a tapped delay line and the value of the decoded signal stored in the latch 508 can dictate the number of taps active in the delay line.

Figure 6:
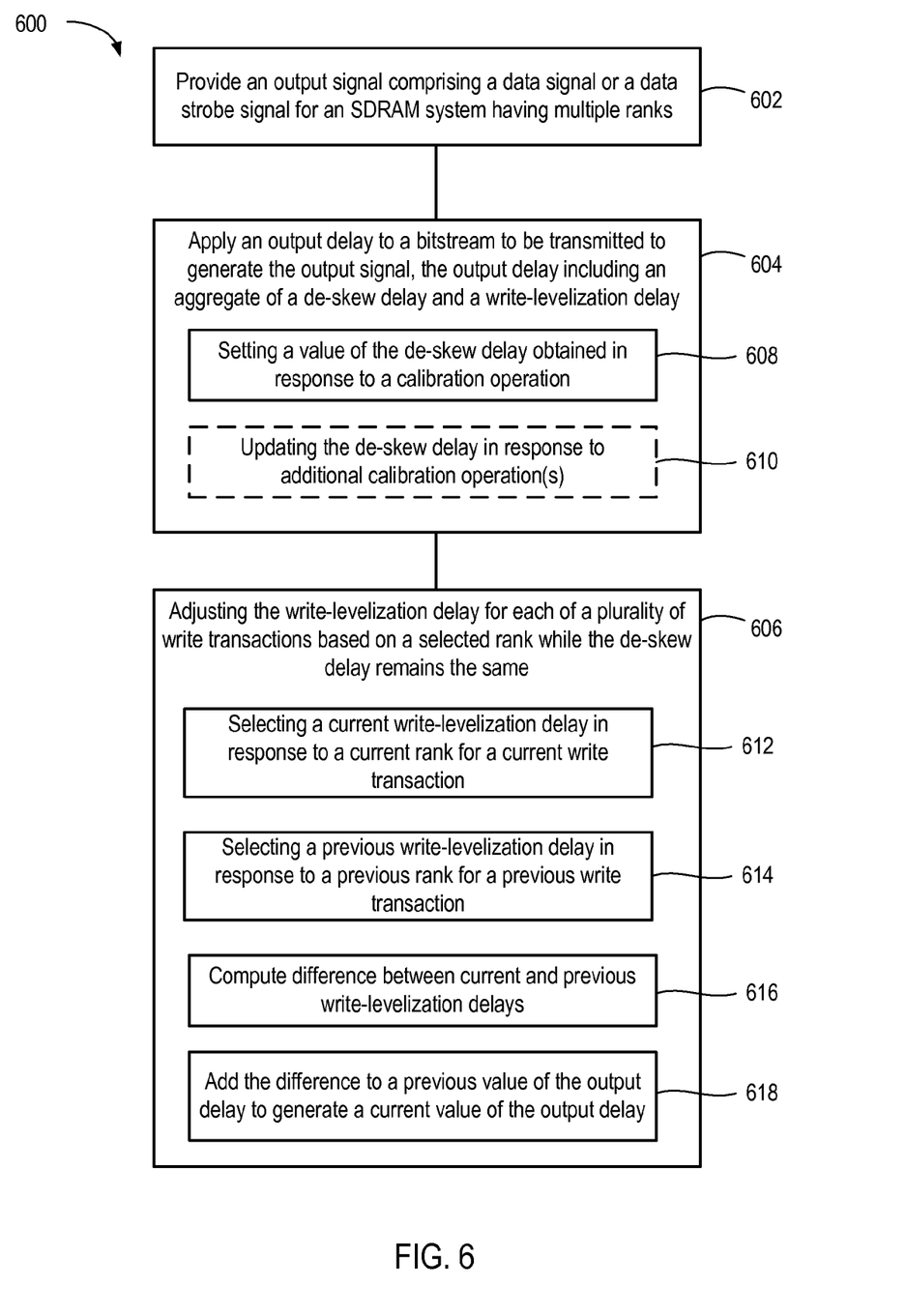
FIG. 6 is a flow diagram showing an example of a method of operating a memory control device.

FIG. 6 is a flow diagram showing an example of a method 600 of operating a memory control device. In general, some steps in the method 600 can be performed sequentially, while other steps in the method 600 can be performed concurrently. The method 600 is not meant to imply any specific sequence of steps. The method 600 includes a step 602, where the output circuit 310 provides an output signal comprising a data signal or a data strobe signal for the SDRAM system 106 having multiple ranks. At step 604, the output delay unit 312 applies an output delay to a bitstream to be transmitted. The output delay includes an aggregate of a de-skew delay and a write-levelization delay. The step 604 can include a step 608, where a value of the de-skew delay obtained in response to a calibration operation is set, for example, at startup. At optional step 610, the de-skew delay can be updated in response to additional calibration operation(s). For example, additional calibration operation(s) can be performed to track voltage/temperature variations of the memory control device 104.

At step 606, the write-levelization delay controller 302 and the output delay unit 312 adjusts the write-levelization delay for each of a plurality of write transactions based on a selected rank while the de-skew delay remains the same. The step 606 can include the following steps: At step 612, the write-levelization delay controller 302 selects a current write-levelization delay value in response to a current rank for a current write transaction. At step 614, the write-levelization delay controller 302 selects a previous write-levelization delay value in response to a previous rank for a previous write transaction. At step 616, the write-levelization delay controller 302 computes a difference between the current and previous write-levelization delay values. At step 618, the output delay unit 312 adds the difference to a previous value of the output delay to generate a current value of the output delay. Steps 612-618 can be repeated for each write transaction. The method 600 can be performed for a plurality of signals on the bus 109.

While the foregoing is directed to specific examples, other and further examples may be devised without departing from the basic scope thereof, and the scope thereof is determined by the claims that follow.

What is claimed is:

1. A memory control device, comprising:
    an output circuit coupled to provide an output signal comprising a data signal or data strobe signal for a synchronous dynamic random access memory (SDRAM) system having a plurality of ranks;
    an output delay unit coupled to apply an output delay to a bitstream to be transmitted to generate the output signal, the output delay comprising an aggregate of a de-skew delay and a write-levelization delay; and
    a write-levelization delay controller coupled to adjust the write-levelization delay for each write transaction to the SDRAM system of a plurality of write transactions based on a selected rank of the plurality of ranks;
    wherein the de-skew delay is the same across the plurality of ranks for each of the plurality of write transactions.

2. The memory control device of claim 1, further comprising:
    de-skew delay register logic coupled to provide the de-skew delay to the output delay unit.

3. The memory control device of claim 2, further comprising:
    a multiplexer circuit operable to selectively couple the write-levelization delay controller and the de-skew delay register logic to the output delay unit; and
    a delay selection controller coupled to control the multiplexer circuit.

4. The memory control device of claim 1, wherein the write-levelization delay controller comprises:
    write-levelization delay register logic coupled to store a write-levelization delay value for each of the plurality of ranks for the output signal;
    a first multiplexer coupled to select a current write-levelization delay value from the write-levelization delay register logic in response to a current rank signal;
    a second multiplexer coupled to select a previous write-levelization delay value from the write-levelization delay register logic in response to a previous rank signal; and
    a computation unit coupled to compute a difference between the current write-levelization delay value and the previous write-levelization delay value.

5. The memory control device of claim 4, wherein the computation unit comprises:
    a 2's complement unit coupled to negate the previous write-levelization delay value; and
    an adder coupled to sum output of the 2's complement unit and the current write-levelization delay value.

6. The memory control device of claim 4, wherein the output delay unit is coupled to add the difference to a previous value of the output delay to generate a current value of the output delay.

7. The memory control device of claim 1, wherein the output delay unit comprises:
    an output delay register coupled to store a value of the output delay;
    an adder coupled to update the value of the output delay;
    a decoder coupled to decode the value of the output delay in the output delay register;
    a latch coupled to latch a decoded value from the decoder; and
    delay logic coupled to delay the bitstream to be transmitted based on the decoded value.

8. A method of operating a memory control device, comprising:
    providing an output signal comprising a data signal or a data strobe signal for a synchronous dynamic random access memory (SDRAM) system having a plurality of ranks;
    applying an output delay to a bitstream to be transmitted to generate the output signal, the output delay comprising an aggregate of a de-skew delay and a write-levelization delay; and
    adjusting the write-levelization delay for each write transaction to the SDRAM system of a plurality of write transactions based on a selected rank of the plurality of ranks while the de-skew delay remains the same across the plurality of ranks for each of the plurality of write transactions.

9. The method of claim 8, further comprising:
    setting a value of the de-skew delay obtained in response to a calibration operation performed prior to the plurality of write transactions.

10. The method of claim 9, further comprising:
    updating the de-skew delay to a new value obtained in response to an additional calibration operation performed subsequent to the plurality of write transactions.

11. The method of claim 8, wherein the step of adjusting comprises:
    selecting a current write-levelization delay value in response to a current rank for a current write transaction;
    selecting a previous write-levelization delay value in response to a previous rank for a previous write transaction; and
    computing a difference between the current write-levelization delay value and the previous write-levelization delay value.

12. The method of claim 11, wherein the step of computing comprises:
    negating the previous write-levelization delay value while dropping a carry bit; and
    adding a negated previous write-levelization delay value and the current write-levelization delay value while dropping a carry bit.

13. The method of claim 11, wherein the step of adjusting comprises:
    adding the difference between the current write-levelization delay value and the previous write-levelization delay value to a previous value of the output delay to generate a current value of the output delay.

14. The method of claim 8, wherein the step of applying comprises:
    decoding a value of the output delay to generate a decoded value; and
    selecting a delay for a delay unit based on the decoded value.

15. A system, comprising:
    a synchronous dynamic random access memory (SDRAM) system having a plurality of ranks; and
    a memory control device, coupled to the SDRAM system through a bus, the memory control device comprising:
        an output circuit coupled to provide an output signal comprising a data signal or data strobe signal;
        an output delay unit coupled to apply an output delay to a bitstream to be transmitted to generate the output signal, the output delay comprising an aggregate of a de-skew delay and a write-levelization delay; and
        a write-levelization delay controller coupled to adjust the write-levelization delay for each write transaction to the SDRAM system of a plurality of write transactions based on a selected rank of the plurality of ranks;

wherein the de-skew delay is the same across the plurality of ranks for each of the plurality of write transactions.

16. The system of claim 15, wherein the bus includes a control bus, and wherein each signal on the control bus is coupled to each SDRAM device on the SDRAM system to provide a fly-by memory topology.

17. The system of claim 15, wherein the memory control device further comprises:

de-skew delay register logic coupled to provide the de-skew delay to the output delay unit;

a multiplexer circuit operable to selectively couple the write-levelization delay controller and the de-skew delay register logic to the output delay unit; and a delay selection controller coupled to control the multiplexer circuit.

18. The system of claim 15, wherein the write-levelization delay controller comprises:

write-levelization delay register logic coupled to store a write-levelization delay value for each of the plurality of ranks for the output signal;

a first multiplexer coupled to select a current write-levelization delay value from the write-levelization delay register logic in response to a current rank signal;

a second multiplexer coupled to select a previous write-levelization delay value from the write-levelization delay register logic in response to a previous rank signal; and a computation unit coupled to compute a difference between the current write-levelization delay value and the previous write-levelization delay value.

19. The system of claim 18, wherein the output delay unit is coupled to add the difference to a previous value of the output delay to generate a current value of the output delay.

20. The system of claim 15, wherein the output delay unit comprises:

an output delay register coupled to store a value of the output delay;

an adder coupled to update the value of the output delay;

a decoder coupled to decode the value of the output delay in the output delay register;

a latch coupled to latch a decoded value from the decoder; and delay logic coupled to delay the bitstream to be transmitted based on the decoded value.

* * * * *